US012761571B2

(12) United States Patent
Choi et al.

(10) Patent No.: US 12,761,571 B2
(45) Date of Patent: Oct. 13, 2026

(54) OVERLAY MEASUREMENT APPARATUS AND OVERLAY MEASUREMENT METHOD

(71) Applicant: AUROS Technology, Inc., Hwaseong-si (KR)

(72) Inventors: Seong Yun Choi, Osan-si (KR); Hyo Sik Ham, Wonju-si (KR)

(73) Assignee: AUROS Technology, Inc., Hwaseong-si (KR)

( * ) Notice: Subject to any disclaimer, the term of this patent is extended or adjusted under 35 U.S.C. 154(b) by 295 days.

(21) Appl. No.: 18/434,204

(22) Filed: Feb. 6, 2024

(65) Prior Publication Data

US 2024/0272560 A1 Aug. 15, 2024

(30) Foreign Application Priority Data

Feb. 14, 2023 (KR) ........................ 10-2023-0019481

(51) Int. Cl.
*G03F 7/00* (2006.01)

(52) U.S. Cl.
CPC ...... *G03F 7/70633* (2013.01); *G03F 7/70666* (2013.01); *G03F 7/706837* (2023.05); *G03F 7/706849* (2023.05)

(58) Field of Classification Search
CPC ............. G03F 7/70633; G03F 7/70666; G03F 7/706837; G03F 7/706849; G01N 21/95607; G01N 21/01; G01N 21/8806; G01N 21/956; G01N 2021/95615; G06T 7/0004; G06T 2207/30148; H10P 74/203; H10P 74/23
See application file for complete search history.

(56) References Cited

U.S. PATENT DOCUMENTS 7,656,518 B2 2/2010 Den Boef et al.
8,138,498 B2 * 3/2012 Ghinovker ........... G01B 11/272 257/E23.179
8,741,668 B1 * 6/2014 Ghinovker .......... G03F 7/70683 382/145
8,860,941 B2 * 10/2014 Lee ........................ G01B 11/00 356/401

(Continued)

FOREIGN PATENT DOCUMENTS

JP 2008258606 A 10/2008
KR 1020050068790 A 7/2005

(Continued)

*Primary Examiner* — Sang H Nguyen
(74) *Attorney, Agent, or Firm* — WILLIAM PARK AND ASSOCIATES LTD.

(57) ABSTRACT

Disclosed is an overlay measurement apparatus which may include: a light source unit configured to direct an illumination to an overlay measurement target formed in a wafer; a lens unit having an objective lens and a lens focus actuator; a detection unit acquiring a focus image at a measurement position; a stage on which the wafer is seated; and a control unit controlling the lens unit to acquire the overlay measurement target, processing a first sample image of the overlay measurement target detected by the detection unit and a second sample image rotated at 180 degrees based on the first sample image and detected, and calculating a difference between the processed images to calculate the difference as a correction image for correcting an image for which overlay is measured.

14 Claims, 10 Drawing Sheets

(56) References Cited

U.S. PATENT DOCUMENTS

| | | | | |
|---|---|---|---|---|
| 10,451,412 | B2 * | 10/2019 | Adel | G01B 11/272 |
| 11,781,996 | B1 * | 10/2023 | Kang | G01N 21/8806<br>356/609 |
| 2003/0223630 | A1 * | 12/2003 | Adel | G03F 9/7011<br>382/145 |
| 2015/0043803 | A1 * | 2/2015 | Jeong | G03F 7/70633<br>382/149 |
| 2017/0322021 | A1 * | 11/2017 | Takagi | G06V 10/24 |
| 2019/0026885 | A1 * | 1/2019 | Gready | G06T 7/68 |
| 2022/0317577 | A1 * | 10/2022 | Manassen | G03F 7/70633 |
| 2022/0326008 | A1 * | 10/2022 | Park | G01B 11/0608 |
| 2022/0334501 | A1 * | 10/2022 | Hajaj | G03F 7/70633 |

FOREIGN PATENT DOCUMENTS

| | | | |
|---|---|---|---|
| KR | 100588911 | B1 | 6/2006 |
| KR | 1020060084922 | A | 7/2006 |
| KR | 1020140039680 | A | 4/2014 |
| KR | 1020150111451 | A | 10/2015 |
| KR | 101604789 | B1 | 3/2016 |
| KR | 1020220003907 | A | 1/2022 |

* cited by examiner

OVERLAY MEASUREMENT APPARATUS AND OVERLAY MEASUREMENT METHOD

CROSS-REFERENCE TO RELATED APPLICATIONS

This application claims priority to and the benefit of Korean Patent Application No. 10-2023-0019481 filed in the Korean Intellectual Property Office on Feb. 14, 2023, the entire contents of which are incorporated herein by reference.

TECHNICAL FIELD

The present invention relates to overlay measurement of a wafer, and to an overlay measurement apparatus and an overlay measurement method.

BACKGROUND ART

In general, with the development of technology, a size of a semiconductor device is becoming smaller, and the density of an integrated circuit on a wafer is increasing. In order to form the integrated circuit on the wafer, a lot of manufacturing processes should be performed so that a desired circuit structure and desired circuit elements are sequentially formed at specific locations. In such a manufacturing process, patterned layers are sequentially generated on the wafer.

Through the repeated lamination processes, electrically activated patterns are generated in the integrated circuit. In this case, if respective structures are not aligned within an error range permitted in a production process, an inference occurs between the electrically activated patterns, and there may be a problem in performance and reliability of the manufactured circuit due to such a phenomenon. In order to measure and verify an alignment error between layers, an overlay measurement device is used, in which a focal position is found through a contrast or a phase difference in an image for the wafer.

At this time, the vertical alignment between the optical device and the stage is not fine, a problem of a measurement error arose from structural defects in an optical device, such as optics alignment, lens quality, and stage leveling.

SUMMARY OF THE INVENTION

The present invention is contrived to solve various problems including the problem, and has been made in an effort to provide an overlay measurement apparatus and an overlay measurement method which can calculate pattern noise information generated by an image of an overlay measurement target, and correct a pixel which becomes noise in actual measurement by using the same. However, such a problem is exemplary and the scope of the present invention is not limited thereto.

An exemplary embodiment of the present invention provides an overlay measurement apparatus. The overlay measurement apparatus may include: a light source unit configured to direct an illumination to an overlay measurement target formed in a wafer; a lens unit having an objective lens condensing the illumination on a measurement position of any one point in the overlay measurement target and a lens focus actuator controlling a distance between the objective lens and the overlay measurement target; a detection unit acquiring a focus image at the measurement position through a beam reflected on the measurement position; a stage on which the wafer is seated; and a control unit controlling the lens unit to acquire the overlay measurement target, processing a first sample image detected by the detection unit for the overlay measurement target and a second sample image detected by the detection unit for the overlay measurement target rotated at 180 degrees based on the first sample image, and calculating a difference between the processed images to produce a correction image for correcting an image for measuring overlay.

According to an exemplary embodiment of the present invention, the control unit may acquire first image information including pixel information for the first sample image, and acquires a first normalization image by normalizing respective pixels for the first sample image for each pixel, and acquire second image information including pixel information for the second sample image, and acquires a second normalization image by normalizing respective pixels for the second sample image for each pixel.

According to an exemplary embodiment of the present invention, the control unit may calculate a pixel-specific difference between the first normalization image acquired by processing the first sample image and the second normalization image acquired by processing the second sample image to produce the correction image.

According to an exemplary embodiment of the present invention, the control unit may include a storage unit storing the first sample image and the second sample image of the overlay measurement target, a normalization processing unit normalizing respective pixels forming the first sample image for each pixel to acquire the first normalization image, and normalizing respective pixels forming the second sample image for each pixel to acquire the second normalization image, an image comparison unit rotating any one of the first normalization image or the second normalization image at 180 degrees, and comparing the first normalization image and the second normalization image, and a correction image calculation unit calculating a difference of the respective pixels forming the first normalization image and the second normalization image, and calculating the difference as the correction image.

According to an exemplary embodiment of the present invention, the control unit controls a 1-$1^{st}$ to 1-$n^{th}$ sample images to be detected at first to $n^{th}$ measurement positions, respectively among the overlay measurement targets formed at the plurality of measurement positions, and normalizes respective pixels for the 1-$1^{st}$ to 1-$n^{th}$ sample images for each pixel to acquire 1-$1^{st}$ to 1-$n^{th}$ normalization images, controls a 2-$1^{st}$ to 2-$n^{th}$ sample images to be detected at the first to $n^{th}$ measurement positions, respectively, and normalizes respective pixels for the 2-$1^{st}$ to 2-$n^{th}$ sample images for each pixel to acquire 2-$1^{st}$ to 2-$n^{th}$ normalization images, and calculates differences of respective pixels corresponding to each other in respective pixels forming the 1-$n^{th}$ normalization image and respective pixels forming the 2-$n^{th}$ normalization image, and calculates a mean for n differences and stores the calculated mean as the correction image.

According to an exemplary embodiment of the present invention, the control unit may include a stage operation unit controlling the stage to be rotated, and rotate the stage at 180 degrees to detect the second sample image.

According to an exemplary embodiment of the present invention, the control unit may include a scale processing unit acquiring a correction scale image by correcting a scale of the correction image so as to be the same as the scale of the measurement image detected by the detection unit in order to measure alignment of a first overlay key and a second overlay key formed in the wafer, and an image correction unit correcting the measurement image by combining or deleting the correction scale image in units of pixels in the measurement image.

Another exemplary embodiment of the present invention provides an overlay measurement method. The overlay measurement method may include: a first normalization image acquiring step of detecting a first sample image for an overlay measurement target formed on a wafer through a detection unit, and normalizing each pixel of the first sample image for each pixel to acquire a first normalization image; a second normalization information acquiring step of detecting a second sample image for the overlay measurement target rotated at 180 degrees based on the first sample image, and normalizing respective pixels for the second sample image for each pixel to acquire second normalization information; and a correction image calculating step of calculating a difference between the first normalization image acquired by processing the first sample image and the second normalization image acquired by processing the second sample image to produce a correction image.

According to an exemplary embodiment of the present invention, the overlay measurement method may further include, before the second normalization information acquiring step, a wafer rotating step of rotating the stage at 180 degrees so as to detect the second sample image rotated at 180 degrees from the first sample image.

According to an exemplary embodiment of the present invention, the first normalization image acquiring step may include a first measurement step of detecting the first sample image at a first measurement position of the overlay measurement target, and a first normalization processing step of acquiring a first normalization image by normalizing respective pixels forming the first sample image for each pixel, and the second normalization image acquiring step may include a second measurement step of detecting the second sample image at the first measurement position, and a second normalization processing step of acquiring a second normalization image by normalizing respective pixels forming the second sample image for each pixel.

According to an exemplary embodiment of the present invention, in the first measurement step, a 1-$1^{st}$ sample image to a 1-$n^{th}$ sample image may be detected at a first measurement position to an $n^{th}$ measurement position, respectively among the overlay measurement targets formed at a plurality of measurement positions, in the first normalization processing step, respective pixels for the 1-$1^{st}$ sample image to the 1-$n^{th}$ sample image may be normalized for each pixel to acquire a 1-$1^{st}$ normalization image to a 1-$n^{th}$ normalization image, in the second measurement step, a 2-$1^{st}$ sample image to a 2-$n^{th}$ sample image may be detected at the first measurement position to the $n^{th}$ measurement position, respectively, and in the second normalization processing step, respective pixels for the 2-$1^{st}$ sample image to the 2-$n^{th}$ sample image may be normalized for each pixel to acquire a 2-$1^{st}$ normalization image to a 2-$n^{th}$ normalization image.

According to an exemplary embodiment of the present invention, in the correction image calculating step, the 1-$n^{th}$ normalization image and the 2-$n^{th}$ normalization image may be compared, differences of respective pixels corresponding to each other in respective pixels forming the 1-$n^{th}$ normalization image and respective pixels forming the 2-$n^{th}$ normalization image may be calculated, and a mean for n differences may be calculated and stored as the correction image.

According to an exemplary embodiment of the present invention, in the correction image calculating step, any one of the first normalization image or the second normalization image may be rotated at 180 degrees and the first normalization image and the second normalization image may be compared, and a difference between respective pixels forming the first normalization image and the second normalization image may be calculated and calculated as the correction image.

According to an exemplary embodiment of the present invention, the overlay measurement method may include: an image measuring step of detecting the measurement image by measuring the overlay measurement target by the detection unit in order to measure the alignment of the first overlay key and the second overlay key formed in the wafer; a scale processing step of acquiring a correction scale image by correcting a scale of the correction image so that the scale of the correction image is the same as the scale of the measurement image; and an image correcting step of correcting the measurement image by combining or deleting the correction scale image in units of pixels in the measurement image to acquire a measurement image from which noise is removed.

According to some exemplary embodiments of the present invention is configured as above, a correction image is calculated through pixel-wise normalization, and applied to a measurement image to calculate an accurate measurement image, and as a result, measurement accuracy is increased, and it is possible to derive a consistent result by correction image data based automatic optimization.

A correction value can be calculated by changing a processor without separate structure addition or change as compared with a conventional overlay measurement apparatus, and an error which occurs for every overlay measurement apparatus and every wafer can be automatically calculated, and the error is reflected to actual overlay measurement to optimize a measurement recipe. Of course, the scope of the present invention is not limited by such an effect.

DETAILED DESCRIPTION

Figure 1:
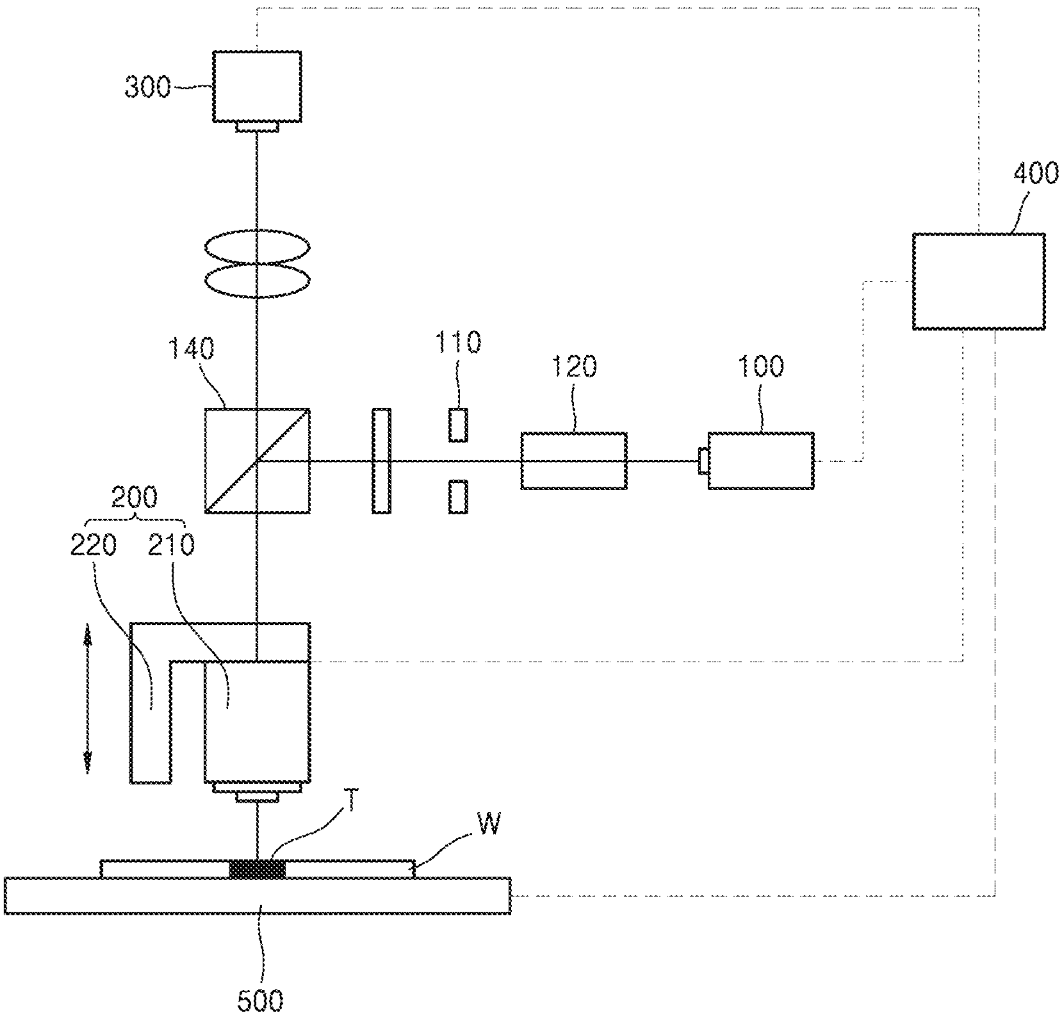
FIG. 1 is a diagram schematically illustrating an overlay measurement apparatus according to an exemplary embodiment of the present invention.

Hereinafter, various preferred embodiment of the present invention will be described in detail with reference to the accompanying drawings.

The exemplary embodiments of the present invention are provided to explain the present invention more completely to those skilled in the art, and the following embodiments may be transformed into several different forms, and the scope of the present invention is not limited to the following embodiments. On the contrary, the exemplary embodiments are provided to be further and complete, and to fully convey the ideas of the present invention to those skilled in the art. In addition, the thickness and size of each layer in the drawing is exaggerated for the convenience and clarity of the description.

Hereinafter, the exemplary embodiments of the present invention will be described with reference to the drawings schematically illustrating the ideal embodiments of the present invention. In the drawings, for example, according to the manufacturing technology and/or tolerance, the deformation of the shown shape may be expected. Accordingly, an exemplary embodiment of the present invention is not interpreted as limited to a specific shape of the area shown herein, and should include, for example, a change in the shape caused by the manufacture.

An overlay measurement system is a system that measures an error between a first overlay key and a second overlay key formed on different layers, respectively, which are formed in a wafer W.

For example, the first overlay key may be an overlay mark formed on a previous layer, and the second overlay key may be an overlay mark formed on a current layer. The overlay mark is formed on a scribe line while a layer for forming a semiconductor device is formed in a die area. For example, the first overlay key may be formed jointly with an insulating film pattern, and the second overlay key may be formed jointly with a photoresist pattern formed on the insulating film pattern. In this case, the second overlay key is exposed to the outside, but the first overlay key is covered by a photoresist layer, and may be made of an oxide having a different optical property from the second overlay key made of a photoresist material.

Physical positions of the first overlay key and the second overlay key may be different from each other, but focus surfaces may be the same as or different from each other.

Figure 2:
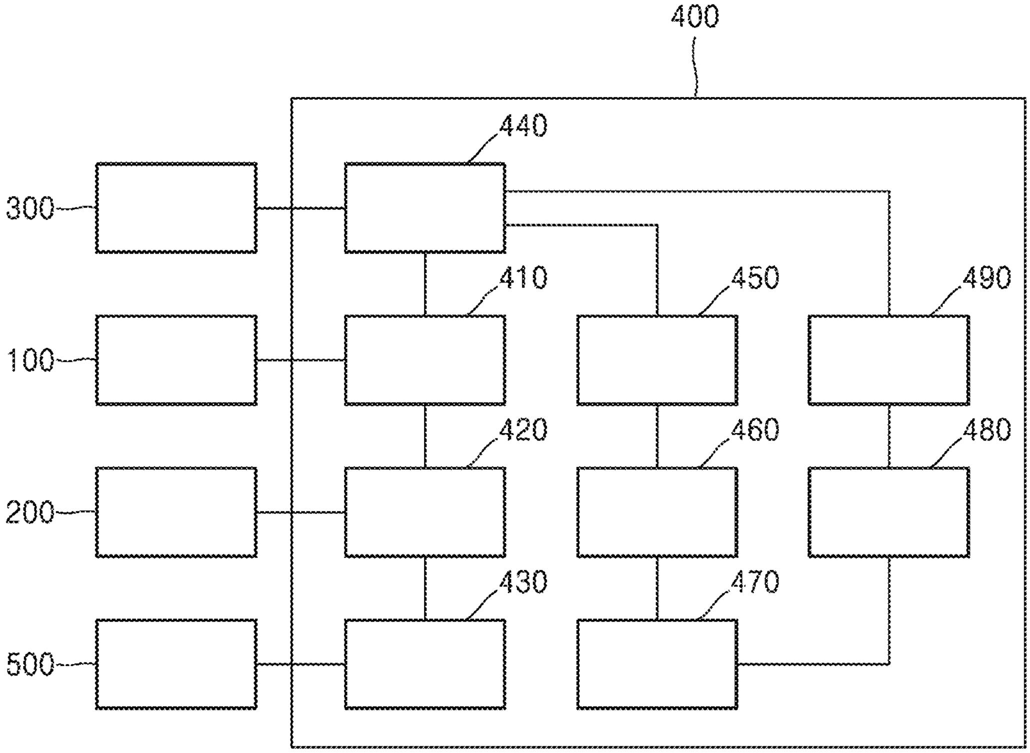
FIG. 2 is a diagram illustrating a control unit of the overlay measurement apparatus according to the present invention.
Figure 3:
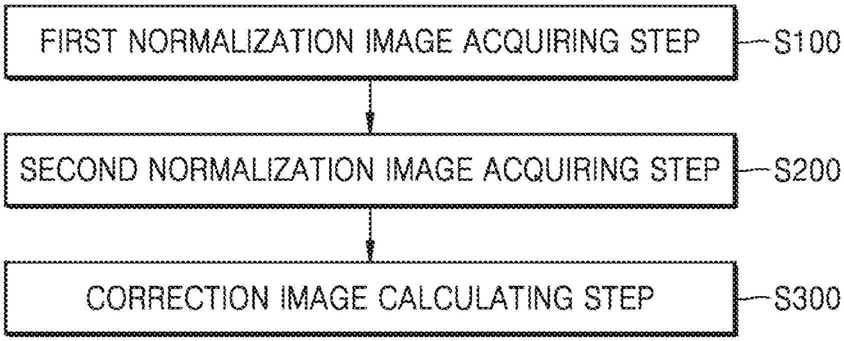
FIGS. 3 to 7 are flowcharts illustrating an overlay measurement method according to an exemplary embodiment of the present invention.

FIG. 1 is a diagram schematically illustrating an overlay measurement apparatus according to an exemplary embodiment of the present invention and FIG. 2 is a diagram illustrating a control unit 400 of the overlay measurement apparatus according to the present invention.

According to an exemplary embodiment of the present invention, the overlay measurement apparatus may generally include a light source unit 100, a lens unit 200, a detection unit 300, a control unit 400, and a stage 500.

As illustrated in FIG. 1, an illumination may be directed from at least one illumination source to an overlay measurement target T. Specifically, the light source unit 100 may be configured to direct an illumination to an overlay measurement target T in which a first overlay key formed in a first layer and a second overlay key formed in a second layer stacked on an upper portion of the first layer are positioned.

For example, the light source unit 100 may be formed as a halogen lamp, a xenon lamp, a supercontinuum laser, a light emitting diode, a laser inducted lamp, etc., and may include various wavelengths such as ultraviolet (UV), visible ray, or infrared rays (IR), etc., and is not limited thereto.

According to an exemplary embodiment of the present invention, the overlay measurement apparatus may include a stop 110, a spectrum filter 120, a polarization filter 130, and a beam splitter 140.

The stop 110 may be formed by an opaque plate with an opening through which light passes, and a beam irradiated by the light source unit 100 may be changed to a form suitable for photographing the overlay measurement target T.

The stop 110 may include at least one of an aperture stop for controlling the amount of light and a field stop for controlling a focusing scope of an image, and may be formed between the light source unit 100 and the beam splitter 140 as illustrated in FIG. 1, and formed between the beam splitter 140 and the lens unit 200 although not illustrated.

The spectrum filter 120 may control a center wavelength and a bandwidth of the beam irradiated by the light source unit 100 to be suitable for acquiring the image of the overlay measurement target T. For example, the spectrum filter 120 may be formed as at least one of a filter wheel, a linear translation device, a flipper device, and a combination thereof.

The beam splitter 140 transmits a part of the beam output from the light source unit 100, and then passing through the stop 110, and reflects a part and separates the beam output from the light source unit 100 into two beams.

As illustrated in FIG. 1, the lens unit 200 may have an objective lens 210 that concentrates the illumination at a measurement position of any one point in the overlay measurement target T and a lens focus actuator 220 that controls a distance between the objective lens 210 and the overlay measurement target T.

The objective lens 210 may concentrate beams reflected on the beam splitter 140 at the measurement position in which the overlay measurement target T is formed in the wafer W, and collect the reflected beams.

The objective lens 210 may be installed in the lens focus actuator 220.

The lens focus actuator 220 controls a distance between the objective lens 210 and the wafer W to control a focal surface to be positioned at an optimal area of the overlay measurement target T.

The lens focus actuator 220 may control a focal distance by vertically moving the objective lens 210 toward the wafer W by the control of the control unit 400.

In this case, the measurement position may be formed at least one point of the overlay measurement target T. In addition, the measurement position may include a plurality of measurement positions according to the driving of the lens unit 200 and the detection unit 300, and include all of a plurality of measurement areas and depths of focus according to the driving of the lens focus actuator 220.

As illustrated in FIG. 1, the detection unit 300 may acquire a focus image at the measurement position through the beam reflected at the measurement position.

The detection unit 300 captures a beam output by passing the beam reflected on the overlay measurement target T through the beam splitter 140 to acquire the image of the overlay measurement target T.

The detection unit 300 may include an optical detector which may measure the beam reflected on the overlay measurement target T, and the optical detector may include, for example, a charge-coupled device (CCD) converting light into a charge to extract the image, a complementary metal-oxide-semiconductor (CMOS) sensor which is one integrated circuit, a photomultiplier tube (PMT) measuring the light, an avalanche photodiode (APD) array as an optical detection device, or various sensors generating or capturing the image.

The detection unit 300 may include a filter, a polarizer, and a beam block, and further include an arbitrary collection optical component (not illustrated) for collecting the illumination collected by the objective lens 210.

As illustrated in FIG. 1, the control unit 400 may control directing of the illumination irradiated by the light source unit 100, and control the lens unit 200 to concentrate the illumination at the overlay measurement target T and collect the reflected beam, and control the detection unit 300 to acquire the focus image measured through the reflected beam collected by the lens unit 200. For example, the control unit 400 may control the light source unit 100, the lens unit 200, and the detection unit 300 to acquire images for each position and depth of focus of the overlay measurement target T by changing the measurement area, the measurement position, or the depth of focus of the overlay measurement target T according to a predetermined set value.

When the control unit 400 detects the measurement image from the overlay measurement target T, the control unit 400 calculates a correction value for correcting a structural error which occurs by the influence of optics alignment, lens quality, stage leveling, etc., and applies to the correction value to a measurement image to calculate an accurate measurement image, and is capable of achieving overlay measurement through a more accurate measurement image.

The control unit 400 of the overlay measurement apparatus according to an exemplary embodiment of the present invention processes a first sample image of the overlay measurement target T detected by the detection unit 300 and a second sample image detected by the detection unit for the overlay measurement target T rotated at 180 degrees based on the first sample image, and calculates a difference between the processed images to produce a correction image for correcting an image for measuring overlay.

Specifically, the control unit 400 may acquire first image information including pixel information for the first sample image and acquire a first normalization image by normalizing each pixel for the first sample image for each pixel, and acquire second image information including pixel information for the second sample image and acquire a second normalization image by normalizing each pixel for the second sample image for each pixel.

In this case, a pixel is a rectangular dot having color information as the minimum unit constituting an image, and the image is constituted by a set of pixels.

Subsequently, the control unit 400 may calculate a pixel-specific difference between the first normalization image acquired by processing the first sample image and the second normalization image acquired by processing the second sample image as the correction image.

For example, the control unit 400 may include a light source operation unit 410, a lens operation unit 420, a stage operation unit 430, a storage unit 440, a normalization processing unit 450, an image comparison unit 460, and a correction image calculation unit 470.

As illustrated in FIG. 2, the light source operation unit 410 may control directing of the illumination irradiated by the light source unit 100, and the lens operation unit 420 may control an operation of the lens focus actuator 220 to concentrate the illumination at the overlay measurement target T and acquire the image for each of the measurement position, the measurement area, and the depth of focus.

As illustrated in FIG. 2, the storage unit 440 may store the first sample image and the second sample image of the overlay measurement target T acquired by the detection unit 300.

For example, in the lens operation unit 420, an image may be measured at the objective lens 210 and a preset measurement position of the overlay measurement target T and stored in the storage unit 440 as the first sample image, and an image of the overlay measurement target T rotated at 180 degrees may be measured at the first measurement position and stored in the storage unit 440 as the second sample image.

In this case, the stage operation unit 430 controls the stage 500 to rotate at 180 degrees to detect the second sample image. In addition, the detection unit 300 is rotated at 180 degrees from the existing position to measure the overlay measurement target T to detect the second sample image rotated by 180 degrees from the first sample image.

The normalization processing unit 450 may normalize the sample images by calculating a mean and a standard deviation so as to calculate noise by comparing respective sample images.

In this case, the normalization may include min-max normalization which sets a smallest value to 0 and a largest value to 1 among all data, and scales all remaining values to a value between 0 and 1 according to a ratio, standardization, and z-score normalization which divides a standard deviation from a mean and readjusts the standard deviation to have an attribute of a standard normal distribution.

That is, the normalization processing unit 450 is a program that processes the image so that all pixel points of the sample image are reflected at the same degree of scale, and the normalization processing unit 450 may express the normalization image as in [Equation 1].

$$Img_f = \frac{RealImg}{\sigma} \qquad \text{[Equation 1]}$$

(Where, $Img_f$: normalization image, RealImg: sample image, σ: standard deviation)

That is, the normalization processing unit 450 divides the sample image RealImg by the standard deviation to acquire a normalization image $Img_f$ subjected to pixel-specific normalization processing.

For example, the normalization processing unit 450 applies the first sample image to [Equation 1] and normalizes each pixel for each pixel to acquire the first normalization image, and normalizes respective pixels forming the second sample image for each pixel to acquire the second normalization image.

The image comparison unit 460 is a program which comparers sample images measured at the same measurement position, and specifically, may compare the first normalization image and the second normalization image by rotating any one of the first normalization image or the second normalization image at 180 degrees.

For example, the stage 500 is rotated at 180 degrees to rotate the second normalization image acquired from the second sample image at 180 degrees in the same direction as the first normalization image, and compare pixels corresponding to each other at the same position.

The correction image calculation unit 470 is a program that calculates the noise by comparing the same images, and specifically, calculates differences between pixels corresponding to each other in the first normalization image and the second normalization image rotated at 180 degrees in the same direction as the first normalization image to calculate the correction image with a mean value thereof.

In this case, the correction image calculation unit 470 may express the correction image as in [Equation 2]. In this case, the first normalized image may be a 0-degree normalization image $Img_{f0}$, and the second normalization image may be a 180-degree normalization image $Img_{f180}$.

$$Img_{diff} = \frac{Img_{f0} - Img_{f180}}{2} \qquad \text{[Equation 2]}$$

(Where, $Img_{diff}$: correction image, $Img_{f0}$: 0-degree normalization image, $Img_{f180}$: 180-degree normalization image)

That is, the correction image calculation unit 470 divides a difference between the first normalized image $Img_{f0}$ and the second normalized image $Img_{f180}$, by 2 which is the mean to acquire the correction image. In this case, the correction image may be stored in the storage unit 440, and the measurement image is enabled to be corrected by applying the correction image during overlay measurement.

According to another exemplary embodiment of the present invention, the control unit 400 may control the correction image to be calculated as images measured at a plurality of measurement positions.

Specifically, the control unit 400 controls a 1-1$^{st}$ to 1-n$^{th}$ sample images to be detected at first to n$^{th}$ measurement positions, respectively among the overlay measurement targets T formed at the plurality of measurement positions, and normalizes respective pixels for the 1-1$^{st}$ to 1-n$^{th}$ sample images for each pixel to acquire 1-1$^{st}$ to 1-n$^{th}$ normalization images.

The control unit 400 controls a 2-1$^{st}$ to 2-n$^{th}$ sample images to be detected at the first to n$^{th}$ measurement positions, respectively, and normalizes respective pixels for the 2-1$^{st}$ to 2-n$^{th}$ sample images for each pixel to acquire 2-1$^{st}$ to 2-n$^{th}$ normalization images.

Subsequently, the control unit 400 may calculate differences of respective pixels corresponding to each other in respective pixels forming the 1-n$^{th}$ normalization image and respective pixels forming the 2-n$^{th}$ normalization image, and calculate a mean for n differences and store the calculated mean as the correction image.

For example, the detection unit 300 may measure a primary image of each of a first measurement position and a second measurement position and the storage unit 440 may store a 1-1$^{st}$ sample image and a 1-2$^{nd}$ sample image, and the storage operation unit 430 may control the stage 500 to rotate at 180 degrees, and then the detection unit 300 may move by finding the first measurement position and the second measurement position to secondarily measure the respective images, and the storage unit 440 may store a 2-1$^{st}$ sample image and a 2-2$^{nd}$ sample image.

The normalization processing unit 450 applies each of the 1-1$^{st}$ sample image, the 1-2$^{nd}$ sample image, the 2-1$^{st}$ sample image, and the 2-2$^{nd}$ sample image to [Equation 1] to acquire respective normalization images, i.e., a 1-1$^{st}$ normalization image, a 1-2$^{nd}$ normalization image, a 2-1$^{st}$ normalization image, and a 2-2$^{nd}$ normalization image.

The image comparison unit 460 may compare the 1-1$^{st}$ normalization image and the 2-1$^{st}$ normalization image, and compare the 2-1$^{st}$ normalization image and the 2-2$^{nd}$ normalization image.

Therefore, the correction image calculation unit 470 calculates a first correction value with a difference of pixels corresponding to each other in the 1-1$^{st}$ normalization image and the 2-1$^{st}$ normalization image, and calculates a second correction value with a difference of pixels corresponding to each other in the 1-2$^{nd}$ normalization image and the 2-2$^{nd}$ normalization image to calculate the correction image with a mean of the first correction value and the second correction value.

That is, with the correction image calculated from the images measured at the plurality of measurement positions, correction reliability may be further increased.

According to an exemplary embodiment of the present invention, in order to apply the correction image stored in the storage unit 440 to the measurement image detected to measure the alignment of the overlay measurement target T, the control unit 400 may include a scale processing unit 480 and an image correction unit 490.

For overlay measurement of the wafer W, the detection unit 300 may measure the image and detect the measurement image. In this case, in order to correct a structural error which occurs by the influence of optics alignment, lens quality, stage leveling, etc., included in the measurement image, the correction image calculated as described above is applied to the measurement image to correct the structural error and measure the overlay in the corrected measurement image.

In this case, the scale processing unit 480 may correct pixel scales of the correction image and the measurement image to be the same so that the correction image may be applied to the measurement image.

Specifically, the scale processing unit 480 is a program that corrects the scale so that the pixel scale of the correction image is the same as the pixel scale of the measurement image.

The image correction unit 490 may correct the measurement image by combining or deleting the correction scale image in units of pixels in the measurement image. That is, the measurement image $Img_{save}$ may be calculated by removing the correction scale image $Img_{diff}*\sigma_{real}$ from the measurement image $Img_{real}$.

For example, as shown in [Equation 3], the correction scale image $Img_{diff}*\sigma_{real}$ may be calculated by applying a scale standard deviation $\sigma_{real}$ of the measurement image to the correction image $Img_{diff}$, and the measurement image $Img_{save}$ may be calculated by deleting the correction scale image $Img_{diff}*\sigma_{real}$ from the measurement image $Img_{real}$.

$$Img_{save} = Img_{real} - Img_{diff} \cdot \sigma_{real} \quad \text{[Equation 3]}$$

(Where, $Img_{save}$: measurement image, $Img_{real}$: measurement image, $Img_{diff}$: correction image, $\sigma_{real}$: scale standard deviation of measurement image)

A series of processes performed by the control unit 400 may include a display unit (not illustrated) so as to be monitored by the user, and may include an input unit (not illustrated) which may be directly controlled by the user.

That is, the sample image and the measurement image stored in the storage unit 440, the normalization image acquired by the normalization processing unit 450, the correction image calculated by the image comparison unit 460 and the correction image calculation unit 470, and the measurement image calculated by the scale processing unit 480 and the image correction unit 490 may be confirmed through the display unit, and the user may directly control the light source operation unit 410, the lens operation unit 420, and the stage operation unit 430 through the input unit, or directly choose, change, and calculate pixel information indicating the normalization image, the correction image, and the scale correction image.

The control unit 400 may include an auto recipe optimization (ARO) program that automatically optimizes an overlay measurement recipe through image correction information, filter optimization information, stop optimization information, focus optimization information, and pin-hole optimization information.

The overlay measurement apparatus may include a memory storing instructions, programs, logic, etc., for controlling operations of respective components of the overlay measurement apparatus by the control unit 400, and the components may be added, changed, or deleted as necessary.

That is, the overlay measurement apparatus according to the present invention may calculates a correction image for correcting a structural error which occurs by the influence of optics alignment, lens quality, stage leveling, etc., and applies to the correction image to a measurement image to calculate an accurate measurement image of which structural error is corrected, and is capable of achieving more accurate overlay measurement through the calculated accurate image.

FIGS. 3 to 7 are flowcharts illustrating an overlay measurement method according to an exemplary embodiment of the present invention.

According to an exemplary embodiment of the present invention, the overlay measurement method may include a first normalization image acquiring step S100, a second normalization image acquiring step S200, and a correction image calculating step S300.

The first normalization image acquiring step S100 is a step of detecting a first sample image of an overlay measurement target T formed on a wafer through a detection unit 300, and normalizing each pixel of the first sample image for each pixel to acquire a first normalization image.

Figure 5:
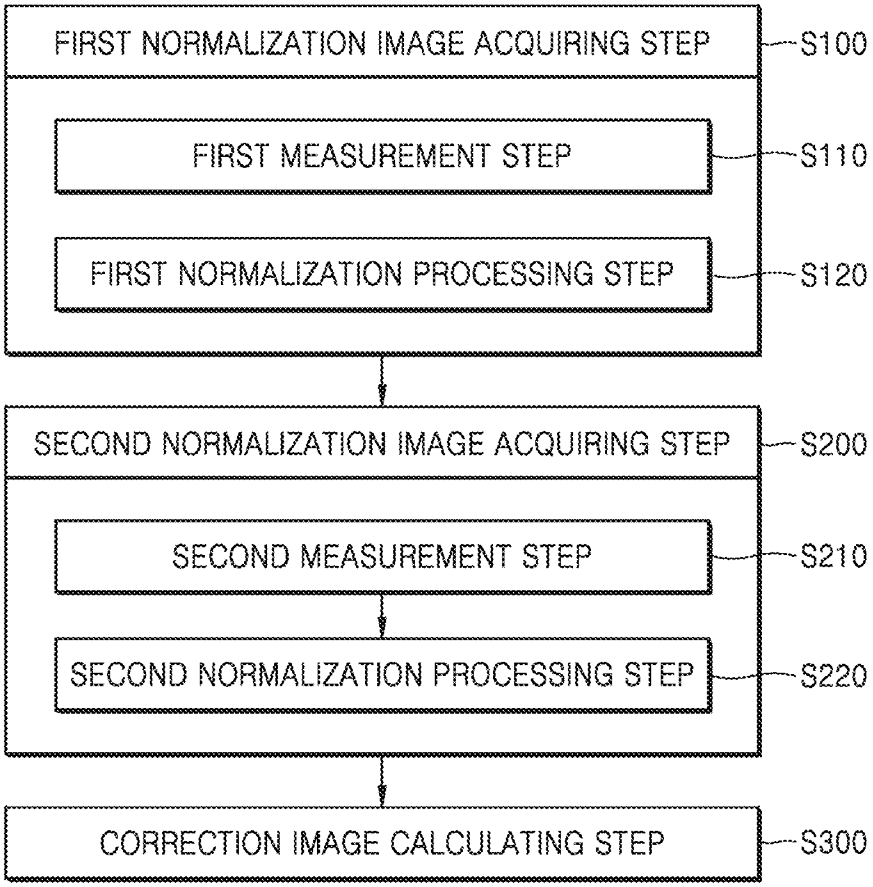

Specifically, as illustrated in FIG. 5, the first normalization image acquiring step S100 may include a first measurement step S110 and a first normalization processing step S120.

The first measurement step S110 is a step of detecting the first sample image at a first measurement position of the overlay measurement target T through the detection unit 300, and the first normalization processing step S120 is a step of normalizing respective pixels forming the first sample image for each pixel to acquire a first normalization image.

Specifically, the first normalization processing step S120 is a step of dividing the first sample image by a standard deviation to acquire a normalization image subjected to pixel-specific normalization processing. For example, in the first normalization processing step S120, respective pixels are normalized for each pixel by applying the first sample image to [Equation 1] to acquire a first normalization image.

$$Img_f = \frac{RealImg}{\sigma} \quad \text{[Equation 1]}$$

(Where, $Img_f$: normalization image, RealImg: sample image, σ: standard deviation)

As illustrated in FIGS. 1 and 5, a second normalization acquiring step S200 is a step of detecting a second sample image rotated at 180 degrees based on the first sample image and detected, and normalizing respective pixels for the second sample image for each pixel to acquire second normalization information.

Specifically, as illustrated in FIG. 5, the second normalization image acquiring step S200 may include a second measurement step S210 and a second normalization processing step S220.

The second measurement step S210 is a step of detecting the second sample image at the first measurement position which is the same position where the first sample image is detected through the detection unit 300, and the second normalization processing step S220 is a step of normalizing respective pixels forming the second sample image for each pixel to acquire a second normalization image.

Specifically, the second normalization processing step S220 is a step of dividing the second sample image by the standard deviation to acquire a normalization image subjected to pixel-specific normalization processing by the same scheme as the first normalization processing step S120. That is, respective pixels are normalized for each pixel by applying the second sample image to [Equation 1] to acquire the second normalization image.

In this case, the sample images are measured as images measured at a plurality of measurement positions in the first normalization image acquiring step S100 and the second normalization image acquiring step S200 to calculate a correction image to be described below.

Figure 6:
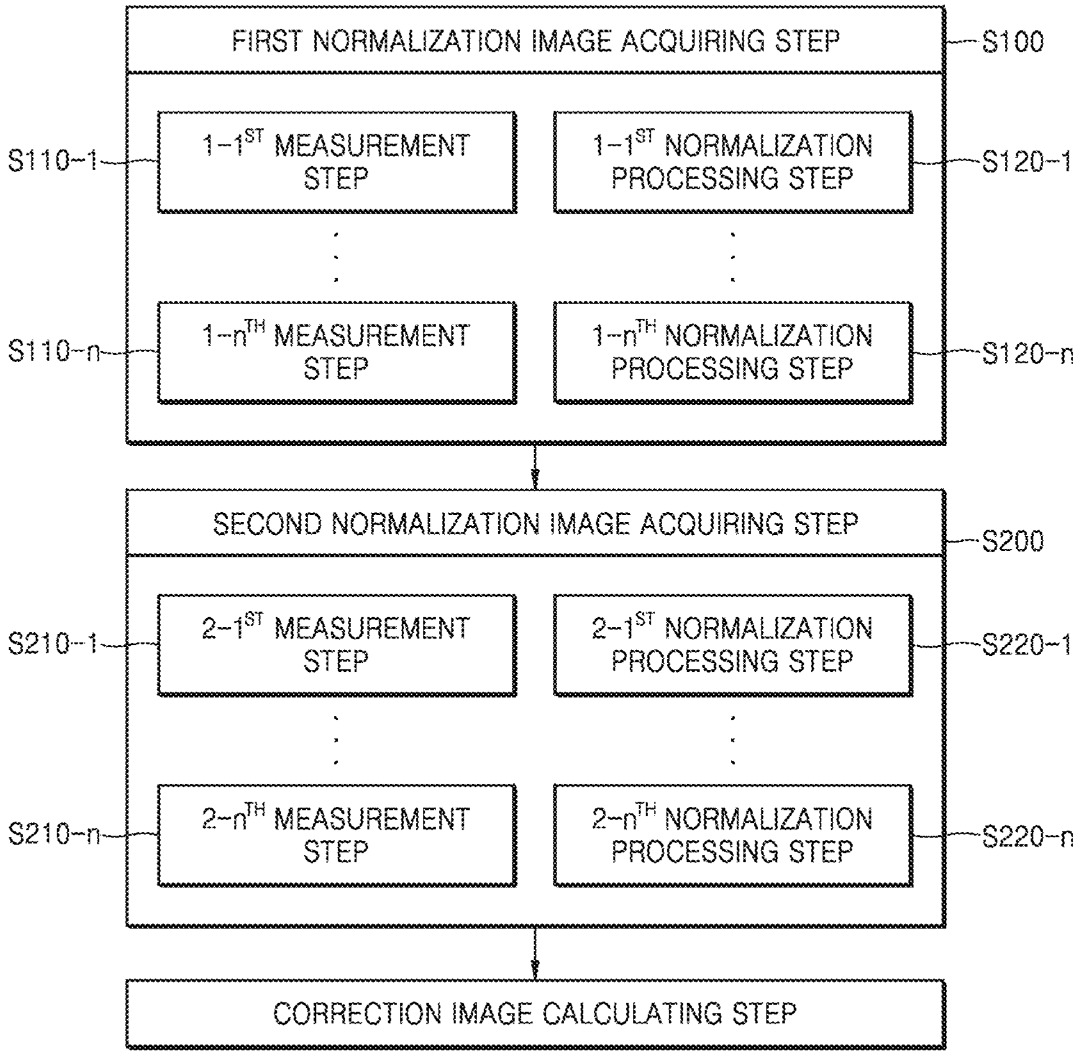

As illustrated in FIG. 6, the first measurement step S110 is a step of detecting a $1\text{-}1^{st}$ sample image to a $1\text{-}n^{th}$ sample image at a first measurement position to an $n^{th}$ measurement position, respectively among overlay measurement targets T formed at a plurality of measurement positions.

For example, in the first measurement step S110, a primary image of each of the first measurement position and a second measurement position is measured, and the $1\text{-}1^{st}$ sample image and a $1\text{-}2^{nd}$ sample image may be stored in the storage unit 440. In this case, the first normalization processing step S120 is a step of normalizing respective pixels for the $1\text{-}1^{st}$ sample image to the $1\text{-}n^{th}$ sample image for each pixel to acquire a $1\text{-}1^{st}$ normalization image to a $1\text{-}n^{th}$ normalization image.

For example, in the first normalization processing step S120, each of the $1\text{-}1^{st}$ sample image and the $1\text{-}2^{nd}$ sample image stored in the first measurement step S110 is applied to [Equation 1] described above to acquire respective normalization images, i.e., the $1\text{-}1^{st}$ normalization image and a $1\text{-}2^{nd}$ normalization image.

As illustrated in FIG. 6, the second measurement step S210 is a step of detecting a $2\text{-}1^{st}$ sample image to a $2\text{-}n^{th}$ sample image at the first measurement position to an $n^{th}$ measurement position, respectively.

For example, in the second normalization image acquiring step S200, the detection unit 300 moves by finding the first measurement position and the second measurement position, and secondarily measures an image of each of the first measurement position and the second measurement position, and the $2\text{-}1^{st}$ sample image and a $2\text{-}2^{nd}$ sample image may be stored in the storage unit 440.

Specifically, in the second normalization processing step S220, respective pixels for the $2\text{-}1^{st}$ sample image to the $2\text{-}n^{th}$ sample image are normalized for each pixel to acquire the $2\text{-}1^{st}$ normalization image to a $2\text{-}n^{th}$ normalization image.

For example, in the second normalization processing step S220, each of the $2\text{-}1^{st}$ sample image and the $2\text{-}2^{nd}$ sample image stored in the second measurement step S210 is applied to [Equation 1] described above to acquire respective normalization images, i.e., the $2\text{-}1^{st}$ normalization image and a $2\text{-}2^{nd}$ normalization image.

Figure 4:
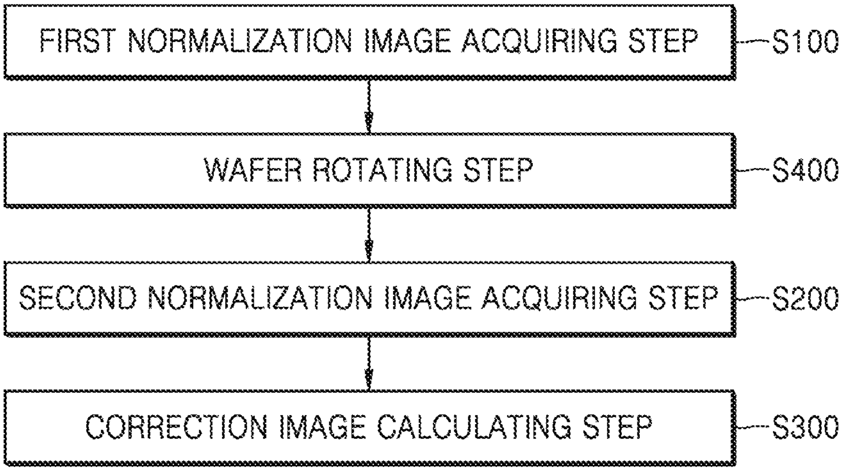

As illustrated in FIG. 4, the overlay measurement method may further include, before the second normalization image acquiring step S200, a wafer rotating step S400 of rotating a stage 500 at 180 degrees so as to detect the second sample image rotated at 180 degrees from the first sample image.

In the wafer rotating step S400, the stage 500 is rotated at 180 degrees to rotate the second normalization image acquired from the second sample image at 180 degrees in the same direction as the first normalization image, and pixels corresponding to each other at the same position may be compared.

When sample images are measured at a plurality of measurement positions, the detection unit 300 may measure a primary image of each of a first measurement position and a second measurement position, and the stage operation unit 430 moves by finding the first measurement position and the second measurement position after the stage 500 rotates at 180 degrees to secondarily measure each image to measure the 2-1$^{st}$ sample image and the 2-2$^{nd}$ sample image, in the wafer rotating step S400.

In the wafer rotating step S400, so as to measure an image in which the wafer W is rotated, the stage 500 is not rotated, but the detection unit 300 is rotated at 180 degrees from the existing position, and when viewed from the detection unit 300, the overlay measurement target T of the rotated wafer W is measured to measure a second sample image rotated at 180 degrees from the first sample image.

As illustrated in FIGS. 3 to 7, the correction image calculating step S300 is a step of calculating a difference between a first normalization image acquired by processing the first sample image and a second normalization image acquired by processing the second sample image as the correction image.

Specifically, the correction image calculating step S300 is a step of rotating any one of the first normalization image or the second normalization image at 180 degrees and comparing the first normalization image and the second normalization image, and calculating a difference between respective pixels forming the first normalization image and the second normalization image and calculating the difference as the correction image.

For example, in the correction image calculation step S300, the second normalization image is rotated at 180 degrees in the same direction as the first normalization image, and differences between pixels corresponding to each other at the same position is calculated to calculate the correction image with a mean value thereof. In this case, in the correction image calculating step S300, a difference between the first normalization image $Img_{f0}$ and the second normalization image $Img_{f180}$ is divided by 2 which is the mean to acquire the correction image as in [Equation 2].

$$Img_{diff} = \frac{Img_{f0} - Img_{f180}}{2} \quad \text{[Equation 2]}$$

(Where, $Img_{diff}$: correction image, $Img_{f0}$: 0-degree normalization image, $Img_{f180}$: 180-degree normalization image)

When the sample images are measured at the plurality of measurement positions, the 1-n$^{th}$ normalization image and the 2-n$^{th}$ normalization image are compared in the correction image calculating step S300, and differences of the pixels corresponding to each other in respective pixels forming the 1-n$^{th}$ normalization image and respective pixels forming the 2-n$^{th}$ normalization image are calculated, and a mean for n differences is calculated to store the calculated mean as the correction image.

For example, in the correction image calculating step S300, a first correction value is calculated with a difference of pixels corresponding to each other in the 1-1$^{st}$ normalization image and the 2-1$^{st}$ normalization image, and a second correction value is calculated with a difference of pixels corresponding to each other in the 1-2$^{nd}$ normalization image and the 2-2$^{nd}$ normalization image to calculate the correction image with a mean of the first correction value and the second correction value, thereby further increasing the correction reliability.

Figure 8:
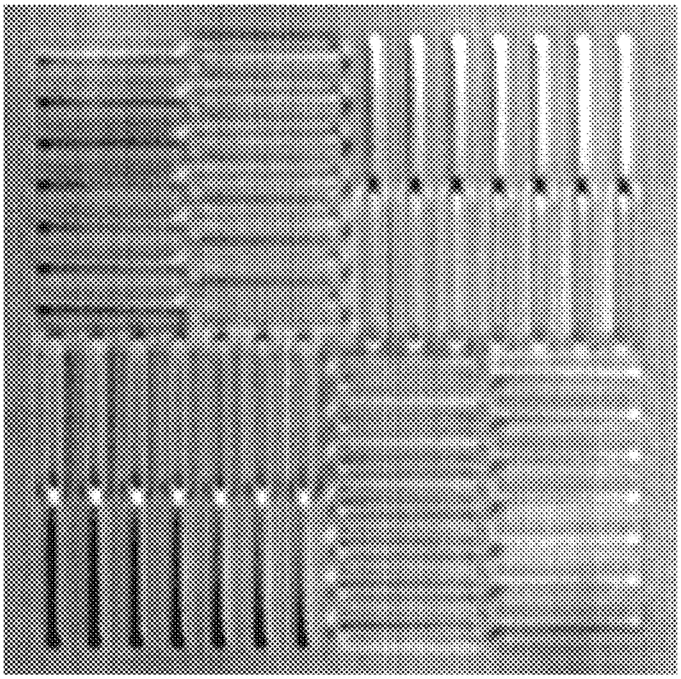
FIG. 8 is a diagram illustrating a correction image according to an exemplary embodiment of the present invention.

For example, as illustrated in FIG. 8, the correction image may be calculated by calculating the difference of the pixels of the first normalization image and the second normalization image. However, FIG. 8 is a diagram for illustrating the correction image, and the correction image may be formed without being limited to various forms, shapes, and sizes according to the image of the overlay measurement target T.

The overlay measurement method according to an exemplary embodiment of the present invention may include an image measuring step S500, a scale processing step S600, and an image correcting step S700.

The image measuring step S500 is a step of detecting the measurement image by measuring the overlay measurement target T by the detection unit 300 in order to measure the alignment of the first overlay key and the second overlay key formed in the wafer W.

Figure 7:
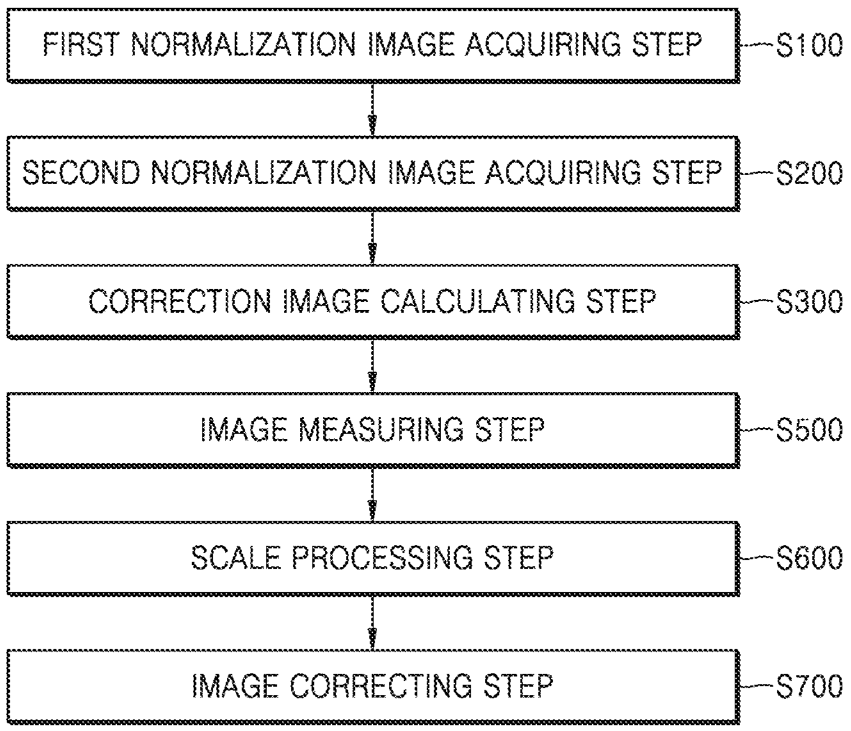

As illustrated in FIG. 7, the scale processing step S600 is a step of acquiring a correction scale image by correcting a scale of a correction image so that the scale of the correction image is the same as the scale of a measurement image.

Specifically, the scale processing step S600 is a step of calculating a correction scale image $Img_{diff}*\sigma_{real}$ by applying a scale standard deviation $\sigma_{real}$ of the measurement image to the correction image $Img_{diff}$ so that pixel scales of the correction image and the measurement image are the same.

As illustrated in FIG. 7, the image correcting step S700 is a step of acquiring a measurement image from which noise is removed by correcting the measurement image by combining or deleting the correction scale image in the measurement image in units of pixels.

For example, as shown in [Equation 3], the correction scale image $Img_{diff}*\sigma_{real}$ may be calculated in the scale processing step S600, and the measurement image $Img_{save}$ may be calculated by deleting the correction scale image $Img_{diff}*\sigma_{real}$ from the measurement image $Img_{real}$ in the image correcting step S700.

$$Img_{save} = Img_{real} - Img_{diff} \cdot \sigma_{real} \quad \text{[Equation 3]}$$

(Where, $Img_{save}$: measurement image, $Img_{real}$: measurement image, $Img_{diff}$: correction image, $\sigma_{real}$: scale standard deviation of measurement image)

Figure 9A:
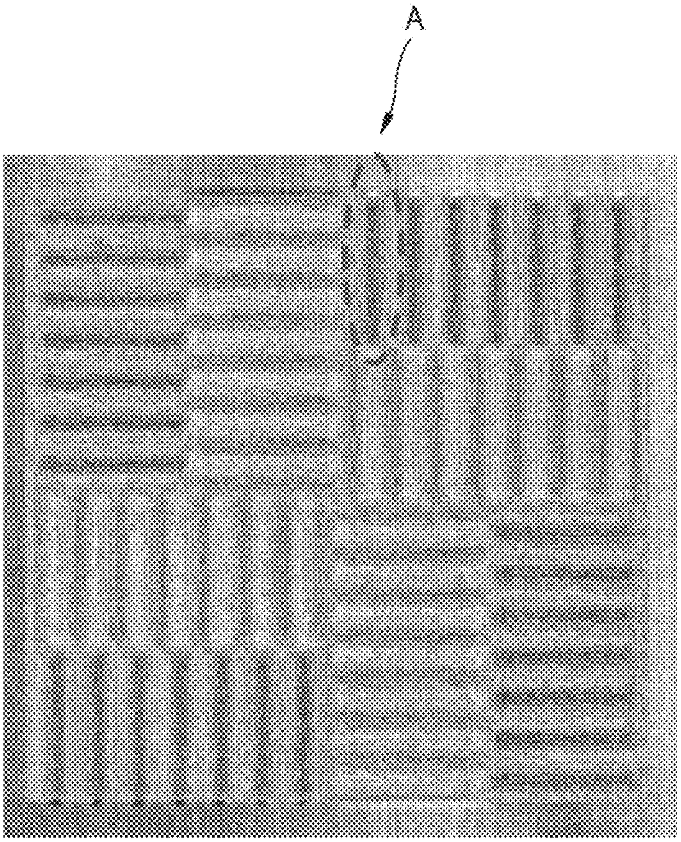
FIGS. 9A and 9B are diagrams illustrating a comparison of measurement images according to whether the correction image being applied according to an exemplary embodiment of the present invention.
Figure 9B:
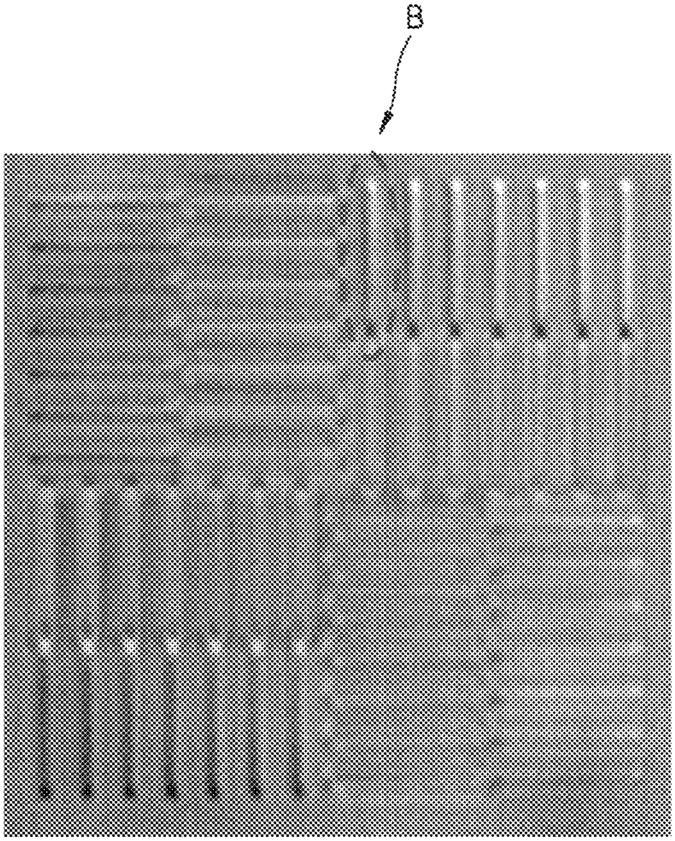

For example, FIGS. 9A and 9B are diagrams illustrating a comparison of measurement images according to whether the correction image being applied according to an exemplary embodiment of the present invention.

As illustrated in FIG. 9A, the correction scale image in the measurement image is combined or deleted, and corrected in units of pixels in the measurement image, and noise is removed to acquire a measurement image in which the shade of pixels is uniform throughout the image may be acquired. On the contrary, in a measurement image which is not corrected in FIG. 9B, the shade of the pixels may not be uniform throughout the image compared with an image to which the correction image is applied in FIG. 9A.

Specifically, when a difference between a left contrast and a right contrast in one pattern of area A in FIG. 9A and a difference between left and right contrasts in area B in FIG. 9B are compared, the contrast difference in area A is smaller than the contrast difference in area B, and the contrast difference in area B is more clearly shown than the contrast difference in area A.

FIGS. 9A and 9B are diagrams for illustrating a measurement image to which the correction image is applied and a measurement image to which the correction image is not applied, and the measurement images may be formed without being limited to various forms, shapes, and sizes according to the image of the overlay measurement target T.

In the overlay measurement method according to the present invention, when the measurement image is detected in the overlay measurement target T, the correction image for correcting the structural error which occurs by the influence of optics alignment, lens quality, stage leveling, etc., is calculated and applied to the measurement image to calculate an accurate measurement image, measurement accuracy may be increased, and a consistent result is enabled to be derived by correction image data based automatic optimization.

In particular, the error which occurs for every overlay measurement apparatus and every wafer W can be automatically calculated, and the error is reflected to actual overlay measurement to optimize a measurement recipe.

The present invention has been described with reference to the exemplary embodiment illustrated in the drawings, but this is just exemplary and it will be appreciated by those skilled in the art that various modifications and other embodiments equivalent thereto can be made therefrom. Accordingly, the true technical scope of the present invention should be defined by the technical spirit of the appended claims.

What is claimed is:

1. An overlay measurement apparatus comprising:

a light source configured to direct illumination to an overlay measurement target formed in a wafer;

a lens assembly including an objective lens configured to condense the illumination on a measurement position and a focus actuator configured to control a distance between the objective lens and the overlay measurement target;

a detection circuit configured to acquire a focus image at the measurement position through a beam reflected on the measurement position;

a stage on which the wafer is seated; and a control circuit configured to control the lens assembly to acquire the overlay measurement target, processing a first sample image detected by the detection circuit for the overlay measurement target and a second sample image detected by the detection circuit for the overlay measurement target rotated at 180 degrees relative to the first sample image, normalizing respective pixels of the first sample image to generate a first normalization image and normalizing respective pixels of the second sample image to generate a second normalization image, rotating one of the first normalization image or the second normalization image at 180 degrees, and calculating a difference between the first normalization image and the rotated second normalization image to produce a correction image for correcting an image for measuring overlay.

2. The overlay measurement apparatus of claim 1, wherein the control circuit acquires first image information including pixel information for the first sample image, and acquires a first normalization image by normalizing respective pixels for the first sample image for each pixel, and acquires second image information including pixel information for the second sample image, and acquires a second normalization image by normalizing respective pixels for the second sample image for each pixel.

3. The overlay measurement apparatus of claim 1, wherein the control circuit calculates a pixel-specific difference between the first normalization image acquired by processing the first sample image and the second normalization image acquired by processing the second sample image to produce the correction image.

4. The overlay measurement apparatus of claim 1, wherein the control circuit includes a storage circuit configured to store the first sample image and the second sample image of the overlay measurement target, a normalization processing circuit configured to normalize respective pixels forming the first sample image for each pixel to acquire the first normalization image, and normalizing respective pixels forming the second sample image for each pixel to acquire the second normalization image, an image comparison circuit configured to rotate any one of the first normalization image or the second normalization image at 180 degrees, and comparing the first normalization image and the second normalization image, and a correction image calculation circuit configured to calculate a difference of the respective pixels forming the first normalization image and the second normalization image, and calculating the difference as the correction image.

5. The overlay measurement apparatus of claim 1, wherein the control circuit controls a 1-$1^{st}$ to 1-$n^{th}$ sample images to be detected at first to $n^{th}$ measurement positions, respectively among the overlay measurement targets formed at the plurality of measurement positions, and normalizes respective pixels for the 1-$1^{st}$ to 1-$n^{th}$ sample images for each pixel to acquire 1-$1^{st}$ to 1-$n^{th}$ normalization images, controls a 2-$1^{st}$ to 2-$n^{th}$ sample images to be detected at the first to $n^{th}$ measurement positions, respectively, and normalizes respective pixels for the 2-$1^{st}$ to 2-$n^{th}$ sample images for each pixel to acquire 2-$1^{st}$ to 2-$n^{th}$ normalization images, and calculates differences of respective pixels corresponding to each other in respective pixels forming the 1-$n^{th}$ normalization image and respective pixels forming the 2-$n^{th}$ normalization image, and calculates a mean for n differences and stores the calculated mean as the correction image.

6. The overlay measurement apparatus of claim 1, wherein the control circuit includes a stage operation circuit configured to control rotation of the stage at 180 degrees to detect the second sample image, wherein the rotation of the stage is performed during acquisition of the second sample image, and rotation of the normalization image is performed after acquisition as part of image processing.

7. The overlay measurement apparatus of claim 1, wherein the control circuit includes a scale processing circuit configured to acquire a correction scale image by correcting a scale of the correction image so as to be the same as the scale of the measurement image detected by the detection unit in order to measure alignment of a first overlay key and a second overlay key formed in the wafer, and an image correction circuit configured to correct the measurement image by combining or deleting the correction scale image in units of pixels in the measurement image.

8. An overlay measurement method comprising:

a first normalization image acquiring step of detecting a first sample image for an overlay measurement target formed on a wafer through a detection unit, and normalizing each pixel of the first sample image for each pixel to acquire a first normalization image;

a second normalization information acquiring step of detecting a second sample image for the overlay measurement target rotated at 180 degrees based on the first sample image, and normalizing respective pixels for the second sample image for each pixel to acquire second normalization information; and a correction image calculating step of calculating a difference between the first normalization image acquired by processing the first sample image and the second normalization image acquired by processing the second sample image to produce a correction image.

9. The overlay measurement method of claim 8, further comprising:

before the second normalization information acquiring step, a wafer rotating step of rotating the stage at 180 degrees so as to detect the second sample image rotated at 180 degrees from the first sample image.

10. The overlay measurement method of claim 8, wherein the first normalization image acquiring step includes a first measurement step of detecting the first sample image at a first measurement position of the overlay measurement target, and a first normalization processing step of acquiring a first normalization image by normalizing respective pixels forming the first sample image for each pixel, and the second normalization image acquiring step includes a second measurement step of detecting the second sample image at the first measurement position, and a second normalization processing step of acquiring a second normalization image by normalizing respective pixels forming the second sample image for each pixel.

11. The overlay measurement method of claim 10, wherein in the first measurement step, a 1-1$^{st}$ sample image to a 1-n$^{th}$ sample image are detected at a first measurement position to an n$^{th}$ measurement position, respectively among the overlay measurement targets formed at a plurality of measurement positions, in the first normalization processing step, respective pixels for the 1-1$^{st}$ sample image to the 1-n$^{th}$ sample image are normalized for each pixel to acquire a 1-1$^{st}$ normalization image to a 1-n$^{th}$ normalization image, in the second measurement step, a 2-1$^{st}$ sample image to a 2-n$^{th}$ sample image are detected at the first measurement position to the n$^{th}$ measurement position, respectively, and in the second normalization processing step, respective pixels for the 2-1$^{st}$ sample image to the 2-n$^{th}$ sample image are normalized for each pixel to acquire a 2-1$^{st}$ normalization image to a 2-n$^{th}$ normalization image.

12. The overlay measurement method of claim 11, wherein in the correction image calculating step, the 1-n$^{th}$ normalization image and the 2-n$^{th}$ normalization image are compared, differences of respective pixels corresponding to each other in respective pixels forming the 1-n$^{th}$ normalization image and respective pixels forming the 2-n$^{th}$ normalization image are calculated, and a mean for n differences is calculated and stored as the correction image.

13. The overlay measurement method of claim 8, wherein in the correction image calculating step, any one of the first normalization image or the second normalization image is rotated at 180 degrees and the first normalization image and the second normalization image are compared, and a difference between respective pixels forming the first normalization image and the second normalization image is calculated and calculated as the correction image.

14. The overlay measurement method of claim 8, comprising:

an image measuring step of detecting the measurement image by measuring the overlay measurement target by the detection unit in order to measure the alignment of the first overlay key and the second overlay key formed in the wafer;

a scale processing step of acquiring a correction scale image by correcting a scale of the correction image so that the scale of the correction image is the same as the scale of the measurement image; and an image correcting step of correcting the measurement image by combining or deleting the correction scale image in units of pixels in the measurement image to acquire a measurement image from which noise is removed.

* * * * *